(12) United States Patent
Jung et al.

(10) Patent No.: US 10,438,927 B2
(45) Date of Patent: Oct. 8, 2019

(54) FAN-OUT SEMICONDUCTOR PACKAGE

(71) Applicant: SAMSUNG ELECTRONICS CO., LTD., Suwon-si (KR)

(72) Inventors: Ha Yong Jung, Suwon-Si (KR); Jae Min Choi, Suwon-Si (KR); Jae Kul Lee, Suwon-Si (KR); Dong Jin Kim, Suwon-Si (KR); Sung Taek Woo, Suwon-Si (KR); Ji Hye Shim, Suwon-Si (KR); Woon Ha Choi, Suwon-Si (KR); Han Sang Cho, Suwon-Si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 0 days.

(21) Appl. No.: 15/986,212

(22) Filed: May 22, 2018

(65) Prior Publication Data
US 2019/0189589 A1    Jun. 20, 2019

(30) Foreign Application Priority Data

Dec. 15, 2017 (KR) .......................... 10-2017-0173582

(51) Int. Cl.
*H01L 25/065* (2006.01)
*H01L 23/538* (2006.01)
(Continued)

(52) U.S. Cl.
CPC ........ *H01L 25/0652* (2013.01); *H01L 21/481* (2013.01); *H01L 21/486* (2013.01);
(Continued)

(58) Field of Classification Search
CPC ... H01L 25/0652; H01L 25/50; H01L 21/486; H01L 21/4857; H01L 21/481;
(Continued)

(56) References Cited

U.S. PATENT DOCUMENTS

2014/0103527 A1    4/2014  Marimuthu et al.
2015/0228628 A1    8/2015  Pagaila et al.
(Continued)

FOREIGN PATENT DOCUMENTS

KR    10-2013-0007261 A    1/2013
KR    10-2017-0072425 A    6/2017
(Continued)

OTHER PUBLICATIONS

Machine Translation of KR 10-20170072425.*
(Continued)

*Primary Examiner* — Anthony Ho
(74) *Attorney, Agent, or Firm* — Sughrue Mion, PLLC

(57) ABSTRACT

A fan-out semiconductor package includes: a core member having a first through-hole and including first and second wiring layer disposed on different levels; a first semiconductor chip disposed in the first through-hole; a second semiconductor chip disposed on the first semiconductor chip in the first through-hole so that a second inactive surface faces a first inactive surface; conductive wires disposed on the core member and a second active surface and electrically connecting second connection pads and the second wiring layer to each other; an encapsulant covering at least portions of the core member, the first semiconductor chip, the second semiconductor chip, and the conductive wires and filling at least portions of the first through-hole; and a connection member disposed on the core member and a first active surface and electrically connecting first connection pads and the first wiring layer to each other.

20 Claims, 22 Drawing Sheets

(51) Int. Cl.
   *H01L 23/00*   (2006.01)
   *H01L 25/00*   (2006.01)
   *H01L 21/48*   (2006.01)

(52) U.S. Cl.
   CPC ...... *H01L 21/4857* (2013.01); *H01L 23/5383* (2013.01); *H01L 23/5389* (2013.01); *H01L 24/09* (2013.01); *H01L 24/24* (2013.01); *H01L 24/25* (2013.01); *H01L 24/32* (2013.01); *H01L 24/48* (2013.01); *H01L 24/49* (2013.01); *H01L 24/50* (2013.01); *H01L 24/73* (2013.01); *H01L 25/50* (2013.01); *H01L 2224/09135* (2013.01); *H01L 2224/2402* (2013.01); *H01L 2224/24101* (2013.01); *H01L 2224/24137* (2013.01); *H01L 2224/24155* (2013.01); *H01L 2224/25171* (2013.01); *H01L 2224/32145* (2013.01); *H01L 2224/48137* (2013.01); *H01L 2224/48159* (2013.01); *H01L 2224/48165* (2013.01); *H01L 2224/48997* (2013.01); *H01L 2224/49171* (2013.01); *H01L 2224/49176* (2013.01); *H01L 2224/73265* (2013.01); *H01L 2224/73267* (2013.01); *H01L 2224/73269* (2013.01); *H01L 2225/06558* (2013.01)

(58) Field of Classification Search
   CPC ......... H01L 24/25; H01L 24/24; H01L 24/50; H01L 24/09; H01L 24/49; H01L 24/48; H01L 24/73; H01L 24/32
   See application file for complete search history.

(56) References Cited

U.S. PATENT DOCUMENTS

2017/0141085 A1   5/2017   Ye et al.
2017/0309571 A1   10/2017  Yi et al.

FOREIGN PATENT DOCUMENTS

| KR | 10-2017-0121671 A | 11/2017 |
|----|-------------------|---------|
| TW | M537303 U         | 2/2017  |
| TW | 201729359 A       | 8/2017  |

OTHER PUBLICATIONS

Machine Translation of KR 10-2013-0007261.*
Korean Office Action dated Sep. 3, 2018 issued in Korean Patent Application No. 10-2017-0173582 (with English translation).
Taiwanese Office Action dated Jan. 9, 2019 issued in Taiwanese Patent Application No. 107118370 (with English translation).

* cited by examiner

FAN-OUT SEMICONDUCTOR PACKAGE

CROSS-REFERENCE TO RELATED APPLICATION(S)

This application claims benefit of priority to Korean Patent Application No. 10-2017-0173582 filed on Dec. 15, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing electrical connection structures outwardly of a region in which a semiconductor chip is disposed.

SUMMARY

An aspect of the present disclosure may provide a fan-out semiconductor package capable of having improved performance and being miniaturized and thinned by stacking a plurality of semiconductor chips in a multi-chip form, and having a high degree of freedom in a design.

According to an aspect of the present disclosure, a fan-out semiconductor package may be provided, in which a core member having a through-hole is introduced, a plurality of semiconductor chips stacked so that inactive surfaces thereof face each other are disposed in the through-hole, a semiconductor chip disposed at an upper portion is electrically connected to a wiring layer of the core member using conductive wires, and a semiconductor chip disposed at a lower portion is electrically connected to another wiring layer of the core member using a connection member.

According to an aspect of the present disclosure, a fan-out semiconductor package may include: a core member having a first through-hole and including first and second wiring layer disposed on different levels; a first semiconductor chip having a first active surface having first connection pads disposed thereon and a first inactive surface opposing the first active surface and disposed in the first through-hole; a second semiconductor chip having a second active surface having second connection pads disposed thereon and a second inactive surface opposing the second active surface and disposed on the first semiconductor chip in the first through-hole so that the second inactive surface faces the first inactive surface; conductive wires disposed on the core member and the second active surface and electrically connecting the second connection pads and the second wiring layer to each other; an encapsulant covering at least portions of the core member, the first semiconductor chip, the second semiconductor chip, and the conductive wires and filling at least portions of the first through-hole; and a connection member disposed on the core member and the first active surface and electrically connecting the first connection pads and the first wiring layer to each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
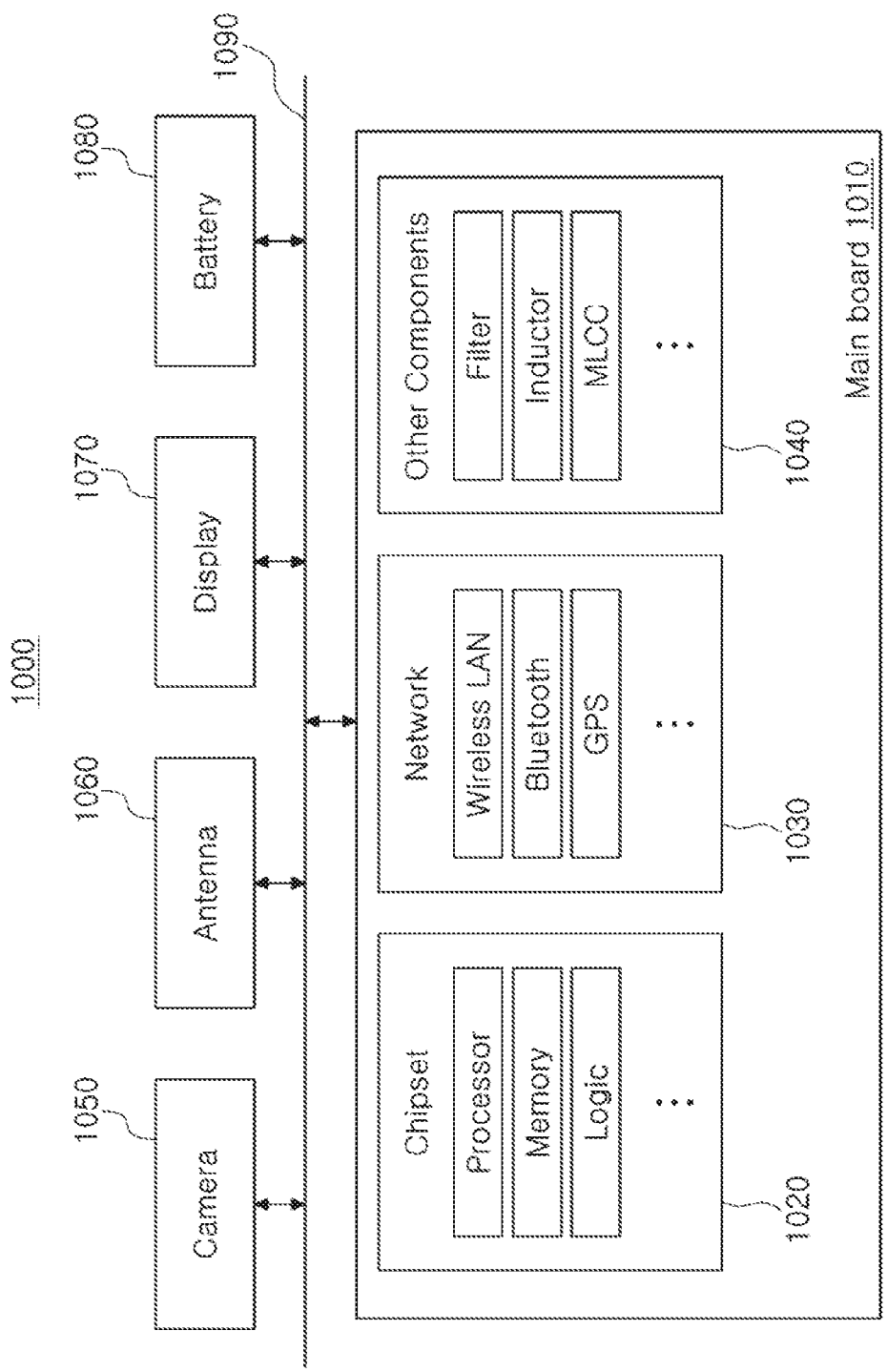
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
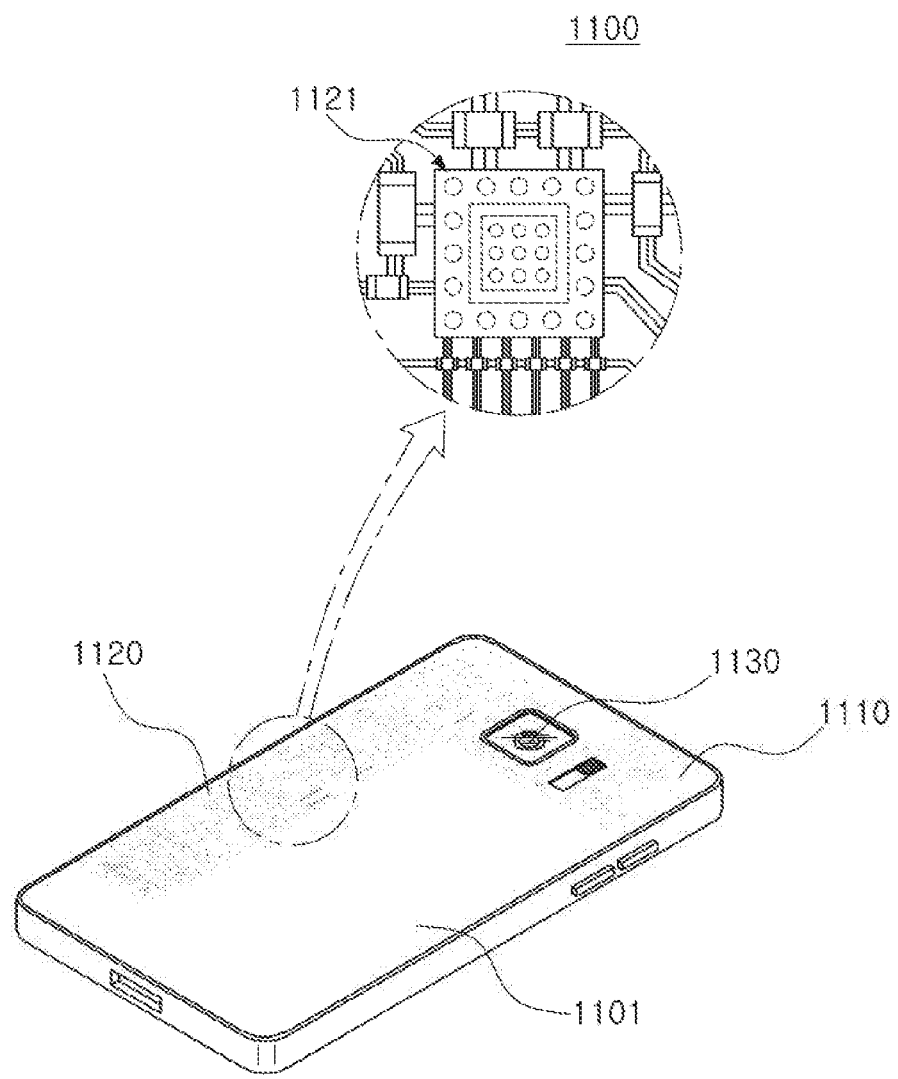
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
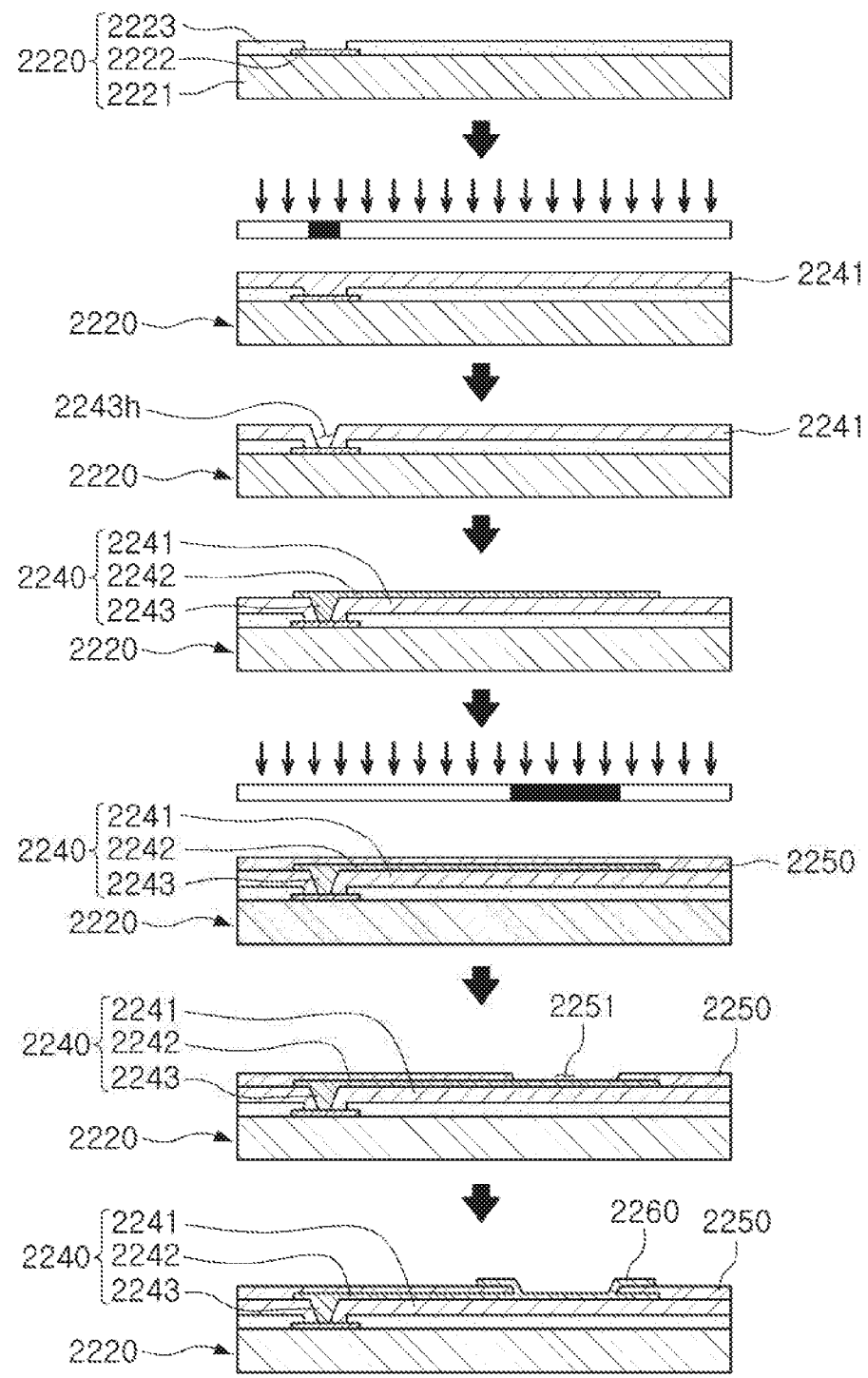
FIG. 4 is schematic cross-sectional views illustrating a packaging process of a fan-in semiconductor package.

FIG. 4 is schematic cross-sectional views illustrating a packaging process of a fan-in semiconductor package.

Figure 3:
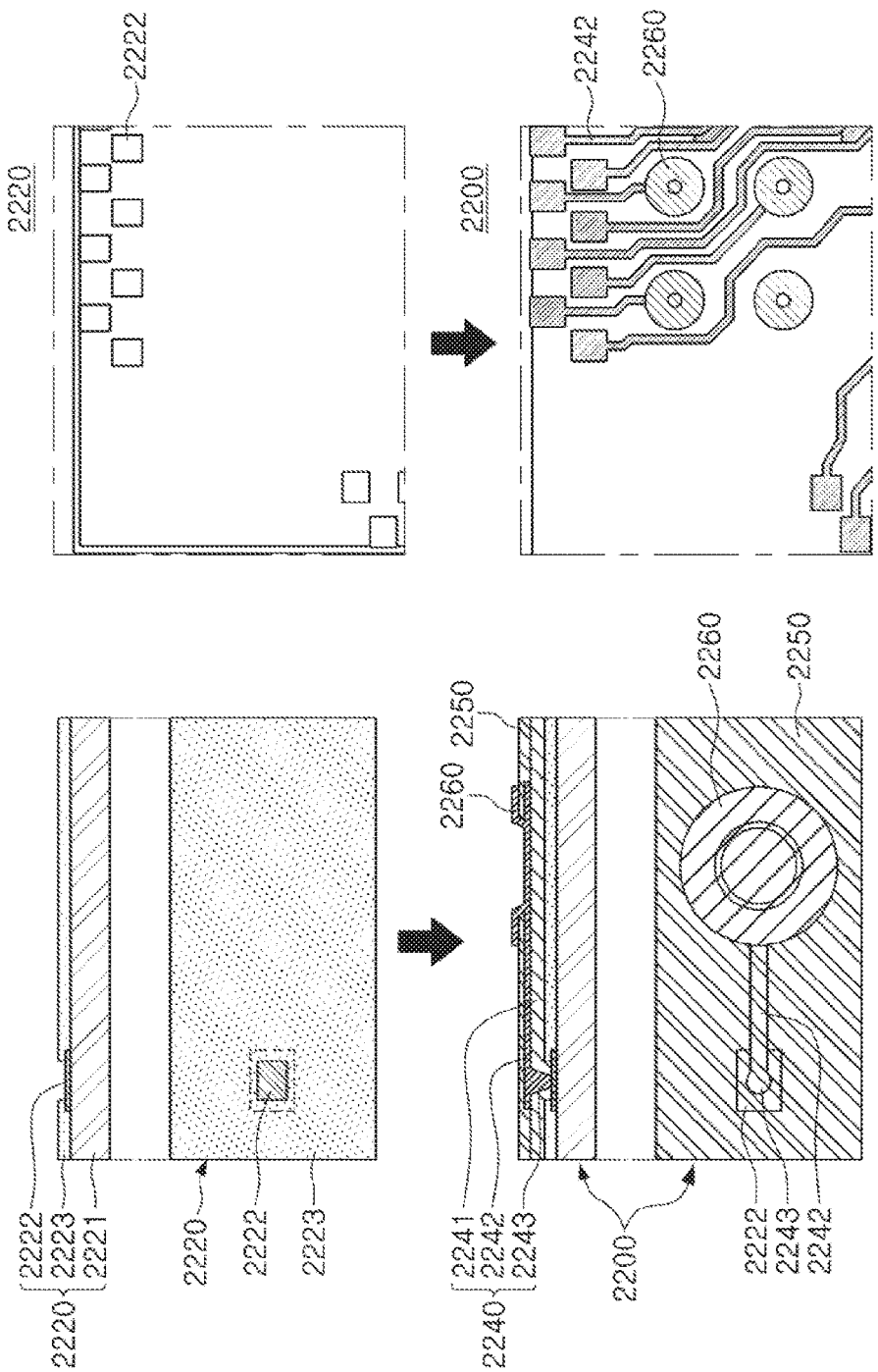
FIGS. 3A and 3B are schematic cross-sectional views illustrating states of a fan-in semiconductor package before and after being packaged.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
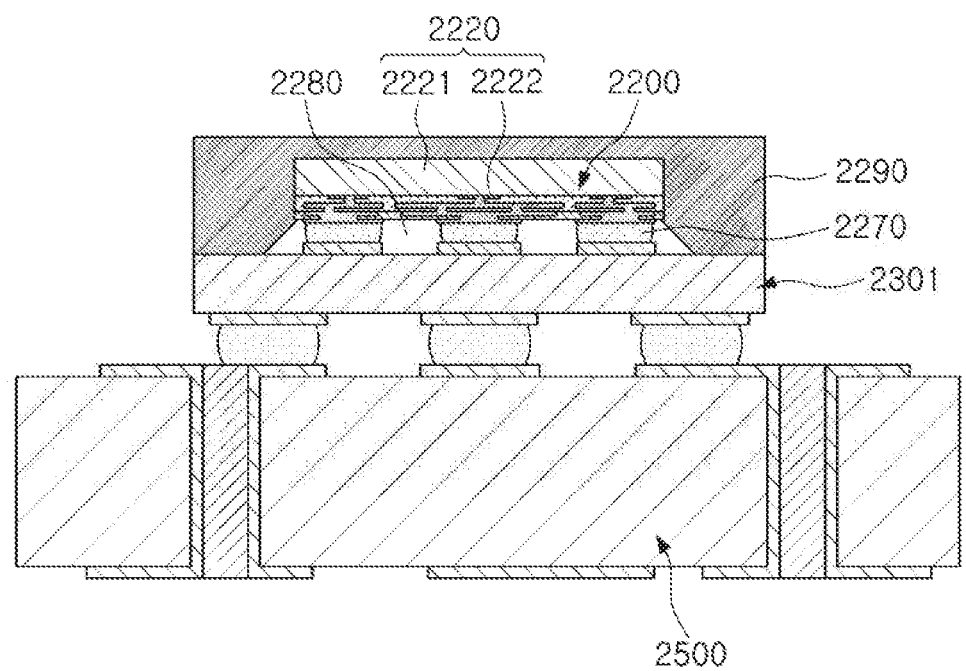
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
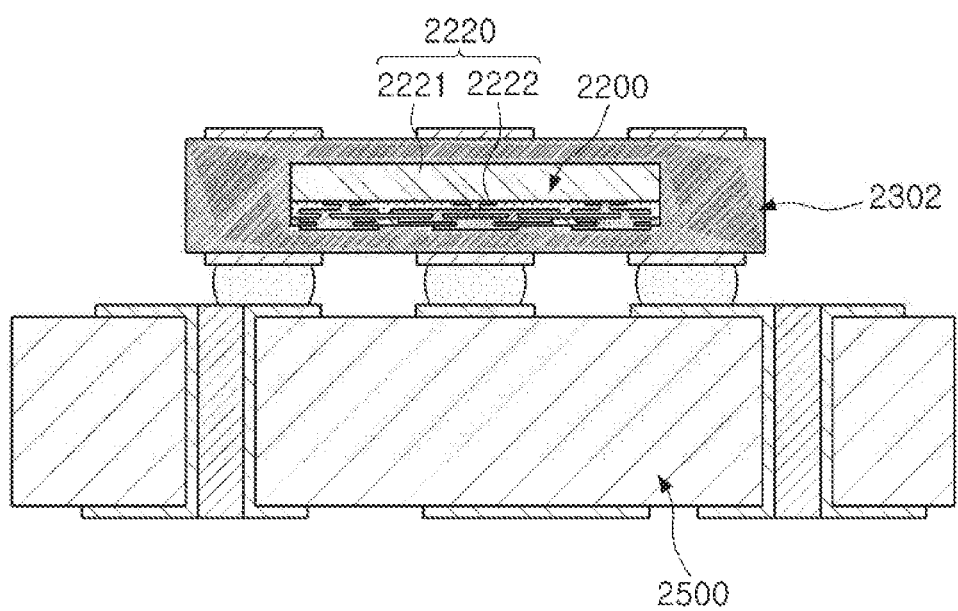
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-out Semiconductor Package

Figure 7:
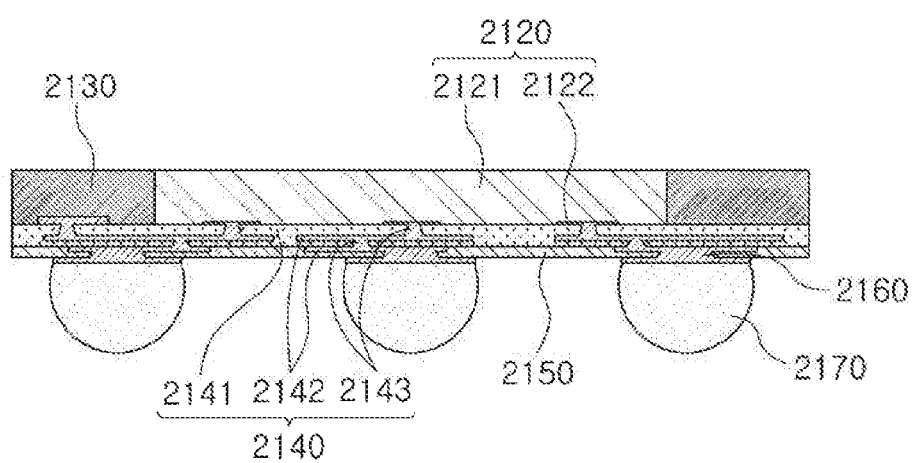
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
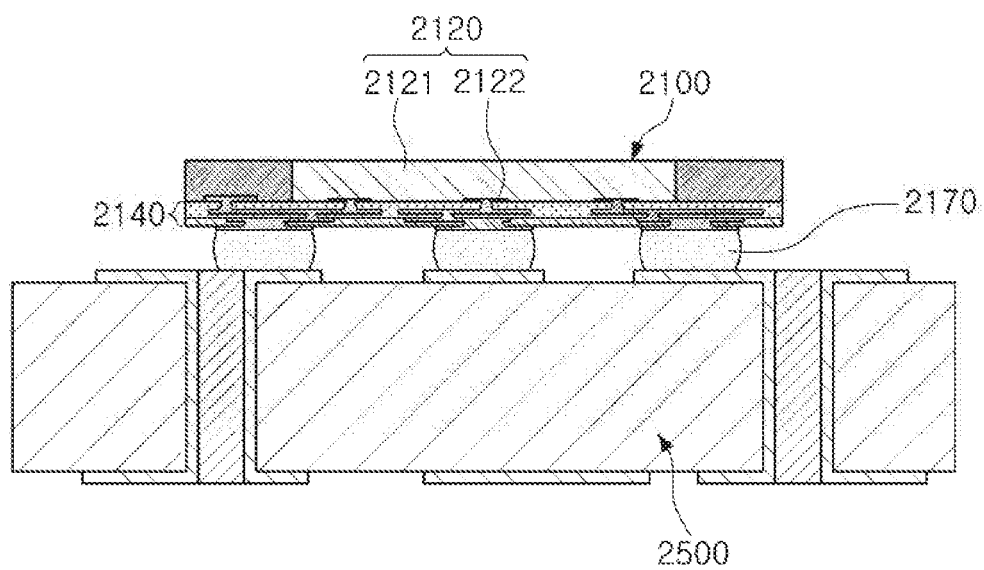
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 maybe be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package capable of having improved performance and being miniaturized and thinned by stacking a plurality of semiconductor chips in a multichip form, and having a high degree of freedom in a design will hereinafter be described with reference to the drawings.

Figure 9:
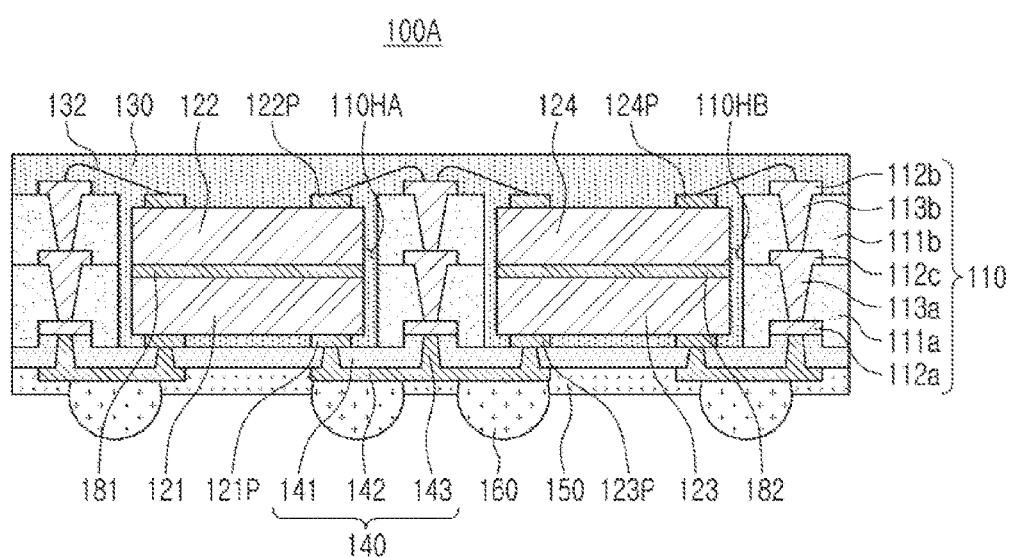
FIG. 9 is a schematic cross-sectional view illustrating an example of a fan-out semiconductor package.

FIG. 9 is a schematic cross-sectional view illustrating an example of a fan-out semiconductor package.

Figure 10:
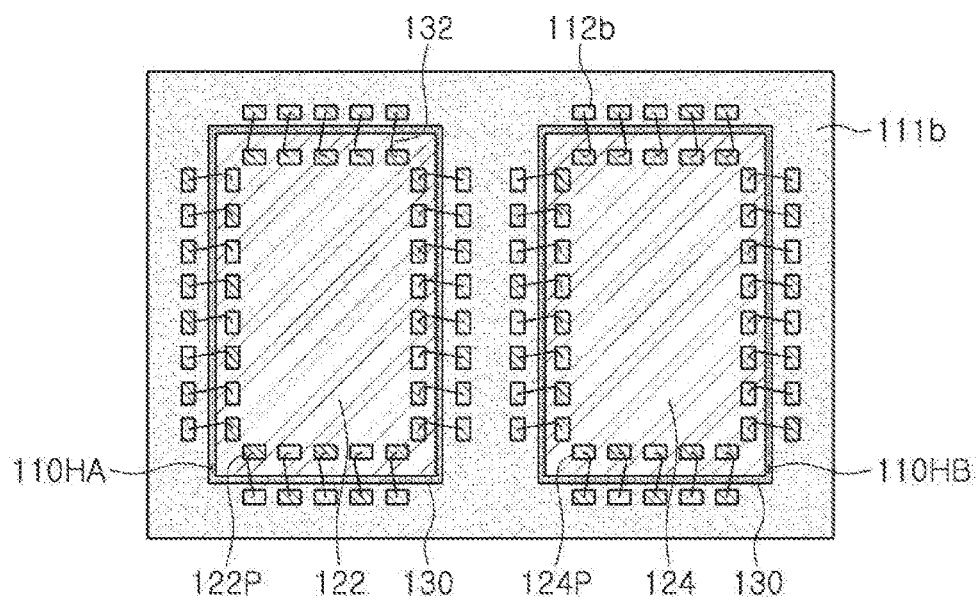
FIG. 10 is a schematic top view illustrating the fan-out semiconductor package of FIG. 9.

FIG. 10 is a schematic top view illustrating the fan-out semiconductor package of FIG. 9.

Referring to FIGS. 9 and 10, a fan-out semiconductor package 100A according to an exemplary embodiment in the present disclosure may include a core member 110 having a first through-hole 110HA and a second through-hole 110HB spaced apart from the first through-hole 110HA and including first and second wiring layers 112a and 112b disposed on different levels, a first semiconductor chip 121 having a first active surface having first connection pads 121P disposed thereon and a first inactive surface opposing the first active surface and disposed in the first through-hole 110HA, a second semiconductor chip 122 having a second active surface having second connection pads 122P disposed thereon and a second inactive surface opposing the second active surface and disposed on the first semiconductor chip 121 in the first through-hole 110HA so that the second inactive surface faces the first inactive surface, a third semiconductor chip 123 having a third active surface having third connection pads 123P disposed thereon and a third inactive surface opposing the third active surface and disposed in the second through-hole 110HB, a fourth semiconductor chip 124 having a fourth active surface having fourth connection pads 124P disposed thereon and a fourth inactive surface opposing the fourth active surface and disposed on the third semiconductor chip 123 in the second through-hole 110HB so that the fourth inactive surface faces the third inactive surface, conductive wires 132 disposed on the core member 110, the second active surface, and the fourth active surface and electrically connecting the second wiring layer 112b to the second connection pads 122P and the fourth connection pads 124P, an encapsulant 130 covering at least portions of the core member 110, the first semiconductor chip 121, the second semiconductor chip 122, the third semiconductor chip 123, the fourth semiconductor chip 124, and the conductive wires 132 and filling at least portions of the first through-hole 110HA and the second through-hole 110HB, a connection member 140 disposed on the core member 110, the first active surface, and the third active surface and electrically connecting the first wiring layer 112a to the first connection pads 121P and the third connection pads 123P, a passivation layer 150 disposed on the other surface of the connection member 140 opposing one surface of the connection member 140 on which the core member 110 is disposed and having openings exposing at least portions of a redistribution layer 142 of the connection member 140, and electrical connection structures 160 formed in the openings of the passivation layer 150 and electrically connected to the exposed redistribution layer 142 of the connection member 140.

Recently, semiconductor chip mounting technology capable of mounting a plurality of semiconductor chips so that many functions may be performed in a single package has been developed. For example, fan-out wafer level package (FO-WLP) technology has advantages that a degree of integration of connection between a semiconductor chip and a circuit board is increased, thermal characteristics and electrical characteristics are improved, and an existing semiconductor process may be utilized as it is. However, in the FO-WLP technology, only one semiconductor chip may be packaged, such that there is a limitation in satisfying a demand of the market for packaging of a plurality of semiconductor chips. Meanwhile, an example of technology of packaging a plurality of semiconductor chips may include multi-die stack package (MDSP) technology of stacking semiconductor chips in a vertical direction. However, in a case of a MDSP, a thickness of a package is excessively increased since the semiconductor chips are simply stacked in the vertical direction, and the package has a structure in which the semiconductor chips stacked at upper and lower portions and having a rectangular shape are disposed and stacked to be approximately vertically misaligned with each other and are then connected to a circuit board disposed below the semiconductor chips, by wire bonding, such that an area occupied by the semiconductor chips disposed to be vertically misaligned with each other is increased, resulting in a limitation in miniaturizing the package.

On the other hand, in the fan-out semiconductor package 100A according to the exemplary embodiment, similar to the FO-WLP technology, the first to fourth semiconductor chips 121, 122, 123, and 124 may be encapsulated with the encapsulant 130, and the first to fourth connection pads 121P, 122P, 123P, and 124P may then be redistributed up to a fan-out region using the connection member 140 having the redistribution layer 142. Therefore, a degree of integration may be increased, thermal characteristics and electrical characteristics may be improved, and an existing semiconductor process may be utilized as it is. In addition, in the fan-out semiconductor package 100A according to the exemplary embodiment, the first and second semiconductor chips 121 and 122 and the third and fourth semiconductor chips 123 and 124 stacked, respectively, at upper and lower portions may be disposed in a side-by-side (SBS) form. Therefore, unlike the MDSP, the fan-out semiconductor package 100A may be thinned, and electrical connection paths between the first and second semiconductor chips 121 and 122 and the third and fourth semiconductor chips 123 and 124 may be significantly decreased. In addition, the first and second semiconductor chips 121 and 122 and the third and fourth semiconductor chips 123 and 124 may be stacked so that inactive surfaces thereof face each other, and the first and second semiconductor chips 121 and 122 and the third and fourth semiconductor chips 123 and 124 that are stacked, respectively, may be electrically connected to the core member 110 in opposite directions. Therefore, the stacked chips are not disposed to be vertically misaligned with each other, but may be disposed in the same direction unlike the MDSP. For example, edges of the first and second semiconductor chips 121 and 122 may be aligned with each other in a stacking direction of the first and second semiconductor chips 121 and 122, and edges of the third and fourth semiconductor chips 123 and 124 may be aligned with each other in a stacking direction of the third and fourth semiconductor chips 123 and 124. Thus, the fan-out semiconductor package 100A may ultimately be miniaturized.

Particularly, the fan-out semiconductor package 100A according to the exemplary embodiment may have a structure in which an electrical path is provided at one side of the fan-out semiconductor package 100A through the conductive wires 132, the conductive wires 132 are encapsulated with the encapsulant 130, and an electrical path is formed at the other side of the fan-out semiconductor package 100A through the redistribution layer 142 of the connection member 140 using flat one surface of the encapsulant 130 as a support member. That is, a degree of freedom in a design may be high, and a separate backside redistribution layer (B-RDL) process, or the like, is not required, and a process may thus be simplified.

The respective components included in the fan-out semiconductor package 100A according to the exemplary embodiment will hereinafter be described in more detail.

The core member 110 may improve rigidity of the fan-out semiconductor package 100A depending on certain materials, and serve to secure uniformity of a thickness of the encapsulant 130.

In addition, the core member 110 may provide electrical connection paths between the semiconductor chips 121 and 122 and the semiconductor chips 123 and 124 stacked at upper and lower portions thereof. That is, the core member 110 may serve as a kind of connection member. The core member 110 may have the first and second through-holes 110HA and 110HB spaced apart from each other, and the first and second semiconductor chips 121 and 122 and the third and fourth semiconductor chips 123 and 124 that are stacked, respectively, may be disposed in the first and second through-holes 110HA and 110HB, respectively. Meanwhile, the core member 110 may have only one through-hole or have a larger number of through-holes, if necessary. Therefore, the number of semiconductor chips disposed in the through-holes may be changed.

The core member 110 may include a first insulating layer 111a, a first wiring layer 112a embedded in the first insulating layer 111a so that one surface thereof is exposed, a third wiring layer 112c disposed on the other surface of the first insulating layer 111a opposing one surface of the first insulating layer 111a in which the first wiring layer 112a is embedded, a second insulating layer 111b disposed on the first insulating layer 111a and covering the third wiring layer 112c, and a second wiring layer 112b disposed on the second insulating layer 111b. The first to third wiring layers 112a, 112b, and 112c may be electrically connected to each other through first and second vias 113a and 113b respectively penetrating through the first and second insulating layers 111a and 111b, and may be electrically connected to the first to fourth connection pads 121P, 122P, 123P, and 124P through the conductive wires 132 and the redistribution layer 142 of the connection member 140.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The wiring layers 112a, 112b, and 112c may serve to redistribute the first to fourth connection pads 121P, 122P, 123P, and 124P. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, electrical connection structure pads, and the like. A thickness of each of the wiring layers 112a, 112b, and 112c may be greater than that of the redistribution layer 142.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113b may be completely filled with the conductive material, or the conductive material may also be formed along a wall of each of via holes. Meanwhile, all the vias 113a and 113b may have tapered shapes of which directions are the same as each other for a reason in a process.

Each of the semiconductor chips 121, 122, 123, and 124 may be an integrated circuit (IC) provided in an amount of several ten to several million or more elements integrated in a single chip. Each of the semiconductor chips 121, 122, 123, and 124 may be formed on the basis of an active wafer. In this case, a base material of a body of each of the semiconductor chips 121, 122, 123, and 124 may be silicon (Si), germanium (Ge), gallium arsenide (GaAs), or the like. Various circuits may be formed on each of the bodies. A material of each of the connection pads 121P, 122P, 123P, and 124P is not particularly limited, but may be a conductive material such as copper (Cu), aluminum (Al), or the like. A redistribution layer (RDL) (not illustrated) may further be formed on each of the bodies, if necessary, and the connection pads 121P, 122P, 123P, and 124P may be primarily redistributed by the redistribution layer 142. In addition, bumps formed of a metal such as copper (Cu) may be disposed on the respective connection pads 121P, 122P, 123P, and 124P. The inactive surfaces of the first and second semiconductor chips 121 and 122 and the third and fourth semiconductor chips 123 and 124 stacked at the upper and lower portions of the core member 110 may be attached to each other through any known adhesion members 181 and 182 such as die attach films (DAFs).

Each of the semiconductor chips 121, 122, 123, and 124 may be an application processor (AP) such as a central processor (for example, a CPU), a graphic processor (for example, a GPU), a field programmable gate array (FPGA), a digital signal processor, a cryptographic processor, a microprocessor, a microcontroller, etc., a memory such as a volatile memory (for example, a DRAM), a non-volatile memory (for example, a ROM), a flash memory (for example, a NAND flash), etc., or an application-specific IC (ASIC), but is not limited thereto. The number of first connection pads 121P of the first semiconductor chip 121 may be more than that of second connection pads 122P of the second semiconductor chip 122. Similarly, the number of third connection pads 123P of the third semiconductor chip 123 may be more than that of fourth connection pads 124P of the fourth semiconductor chip 124. The reason is that the second and fourth semiconductor chips 122 and 124 are connected to the conductive wires 132 and it is thus somewhat difficult to implement fine pitches in the second and fourth semiconductor chips 122 and 124, while the first and third semiconductor chips 121 and 123 are connected to the redistribution layer 142 and it is thus possible to implement fine pitches in the first and third semiconductor chips 121 and 123. In terms of this, when all of the first to fourth semiconductor chips 121, 122, 123, and 124 are memories, dispositions of upper and lower portions of the first to fourth semiconductor chips 121, 122, 123, and 124 may be different from each other depending on the number of inputs/outputs (I/Os), and when the first to fourth semiconductor chips 121, 122, 123, and 124 are a combination of an AP, an ASIC, and memories, the AP and the ASIC may be disposed as the first and third semiconductor chips 121 and 123, respectively, and the memories may be disposed as the second and fourth semiconductor chips 122 and 124.

The encapsulant 130 may protect the core member 110, the semiconductor chips 121, 122, 123, and 124, and the like. An encapsulation form of the encapsulant 130 is not particularly limited, but may be a form in which the encapsulant 130 surrounds at least portions of the core member 110, the semiconductor chips 121, 122, 123, and 124, and the like. For example, the encapsulant 130 may cover at least portions of the core member 110 and the semiconductor chips 121, 122, 123, and 124, and fill at least portions of the through-holes 110HA and 110HB. Meanwhile, the encapsulant 130 may fill the through-holes 110HA and 110HB to thus serve as an adhesive and reduce buckling of the semiconductor chips 121, 122, 123, and 124 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a photoimagable encapsulant (PIE) resin may also be used as the insulating material.

The conductive wires 132 may electrically connect the second and fourth connection pads 122P and 124P of the second and fourth semiconductor chips 122 and 124 to the second wiring layer 112b of the core member 110, and may be encapsulated by the encapsulant 130. Each of the conductive wires 132 may be any known wire used for wire bonding, and may include any known conductive material such as copper (Cu).

The connection member 140 may electrically connect the first and third connection pads 121P and 123P of the first and third semiconductor chips 121 and 123 to the first wiring layer 112a of the core member 110. In addition, the connection member 140 may redistribute the first to fourth connection pads 121P, 122P, 123P, and 124P. In addition, the connection member 140 may electrically connect the first and second semiconductor chips 121 and 122 and the third and fourth semiconductor chips 123 and 124 disposed in a side-by-side (SBS) form to each other. The connection member 140 may include an insulating layer 141 disposed on the core member 110, the first active surface, and the third active surface, and covering at least portions of the first wiring layer 112a, the first connection pads 121P, and the third connection pads 123P, the redistribution layer 142 disposed on the insulating layer 141, and vias 143 penetrating through the insulating layer 141 and electrically connecting the redistribution layer 142 to the first wiring layer 112a, the first connection pads 121P, and the third connection pads 123P. The connection member may also include larger numbers of insulating layers, redistribution layers, and vias, if necessary.

A material of the insulating layer 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 maybe formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other, such that a boundary therebetween may also not be apparent.

The redistribution layer 142 may serve to substantially redistribute the connection pads 121P, 122P, 123P, and 124P. A material of the redistribution layer 142 may be a conductive material such as copper (Cu), aluminum (Al), silver (Ag), tin (Sn), gold (Au), nickel (Ni), lead (Pb), titanium (Ti), or alloys thereof. The redistribution layer 142 may perform various functions depending on a design of a corresponding layer. For example, the redistribution layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 142 may include various pad patterns, and the like.

The vias 143 may electrically connect the redistribution layer 142, the first wiring layer 112a, the connection pads 121P and 123P, and the like, formed on different layers to each other. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. Meanwhile, each of the vias 143 of the connection member 140 may have a tapered shape of which a direction is opposite to that of each of the vias 113a, 113b, and 113c of the core member 110.

The passivation layer 150 may be disposed on the connection member 140, if necessary. The passivation layer 150 may protect the connection member 140 from external physical or chemical damage. The passivation layer 150 may have the openings exposing at least portions of the redistribution layer 142 of the connection member 140. The number of openings formed in the passivation layer 150 may be several tens to several thousands. A surface treatment layer may be formed on a surface of the exposed redistribution layer 142. A material of the passivation layer 150 is not particularly limited. For example, an insulating material may be used as the material of the passivation layer 150. In this case, the insulating material maybe a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a solder resist may also be used.

The electrical connection structures 160 may be disposed in the openings of the passivation layer 150, if necessary. The electrical connection structures 160 may physically or electrically externally connect the fan-out semiconductor package 100A. For example, the fan-out semiconductor package 100A may be mounted on the mainboard of the electronic device through the electrical connection structures 160. Each of the electrical connection structures 160 may be formed of a low melting point metal, for example, a solder such as tin (Sn)-aluminum (Al)-copper (Cu), or the like. However, this is only an example, and a material of each of the electrical connection structures 160 is not particularly limited thereto. Each of the electrical connection structures 160 may be a land, a ball, a pin, or the like. The electrical connection structures 160 may be formed as a multilayer or single layer structure. When the electrical connection structures 160 are formed as a multilayer structure, the electrical connection structures 160 may include a copper (Cu) pillar and a solder. When the electrical connection structures 160 are formed as a single layer structure, the electrical connection structures 160 may include a tin-silver solder or copper (Cu). However, this is only an example, and the electrical connection structures 160 are not limited thereto.

The number, an interval, a disposition form, and the like, of electrical connection structures 160 are not particularly limited, but may be sufficiently modified depending on design particulars by those skilled in the art. For example, the electrical connection structures 160 may be provided in an amount of several tens to several thousands according to the numbers of connection pads 121P, 122P, 123P, 124P, or may be provided in an amount of several tens to several thousands or more or several tens to several thousands or less. At least one of the electrical connection structures 160 may be disposed in a fan-out region. The fan-out region refers to a region except for a region in which the semiconductor chips 121, 122, 123, and 124 are disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Figure 11A:
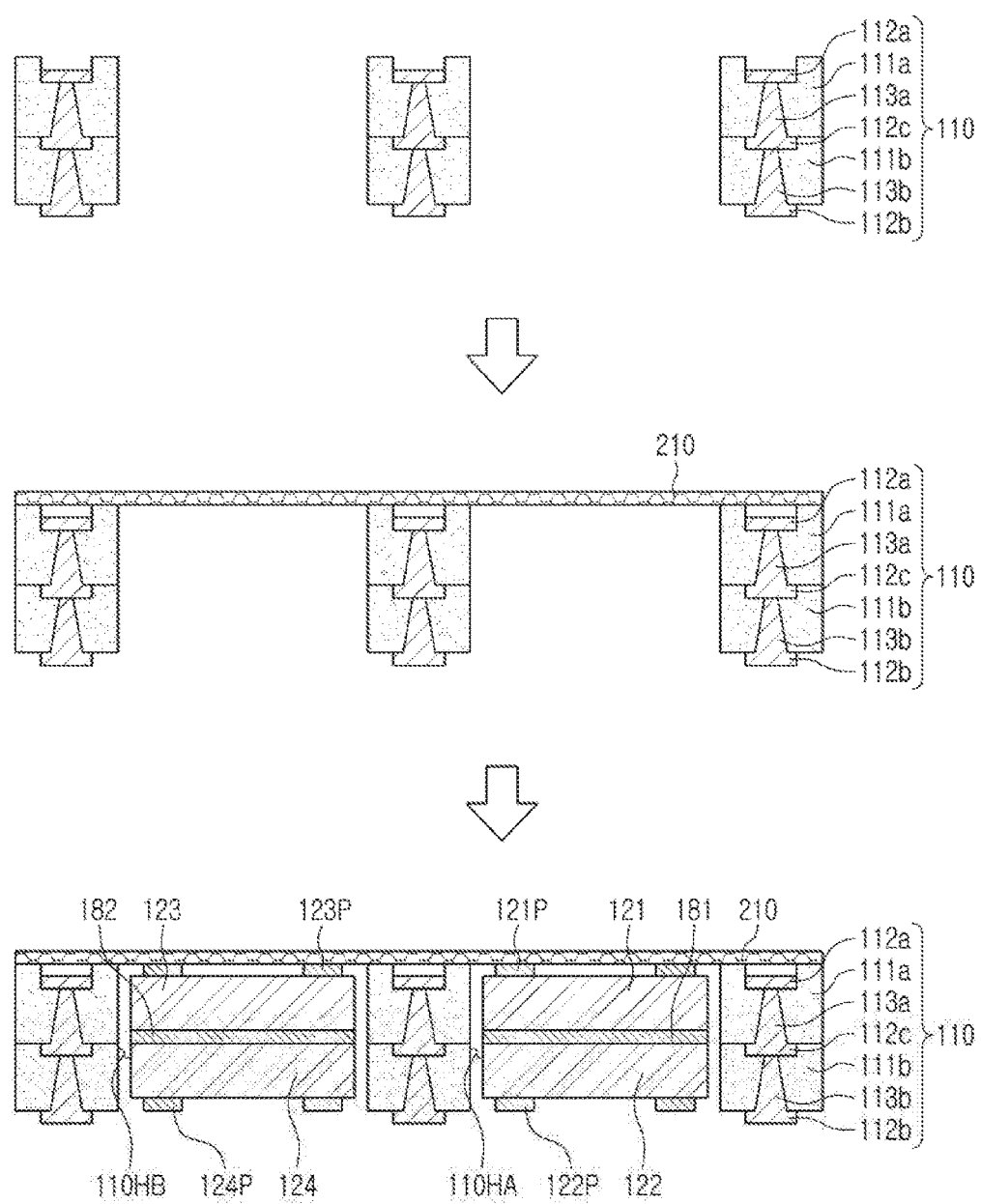
FIGS. 11A through 11C are schematic views illustrating processes of manufacturing the fan-out semiconductor package of FIG. 9.
Figure 11B:
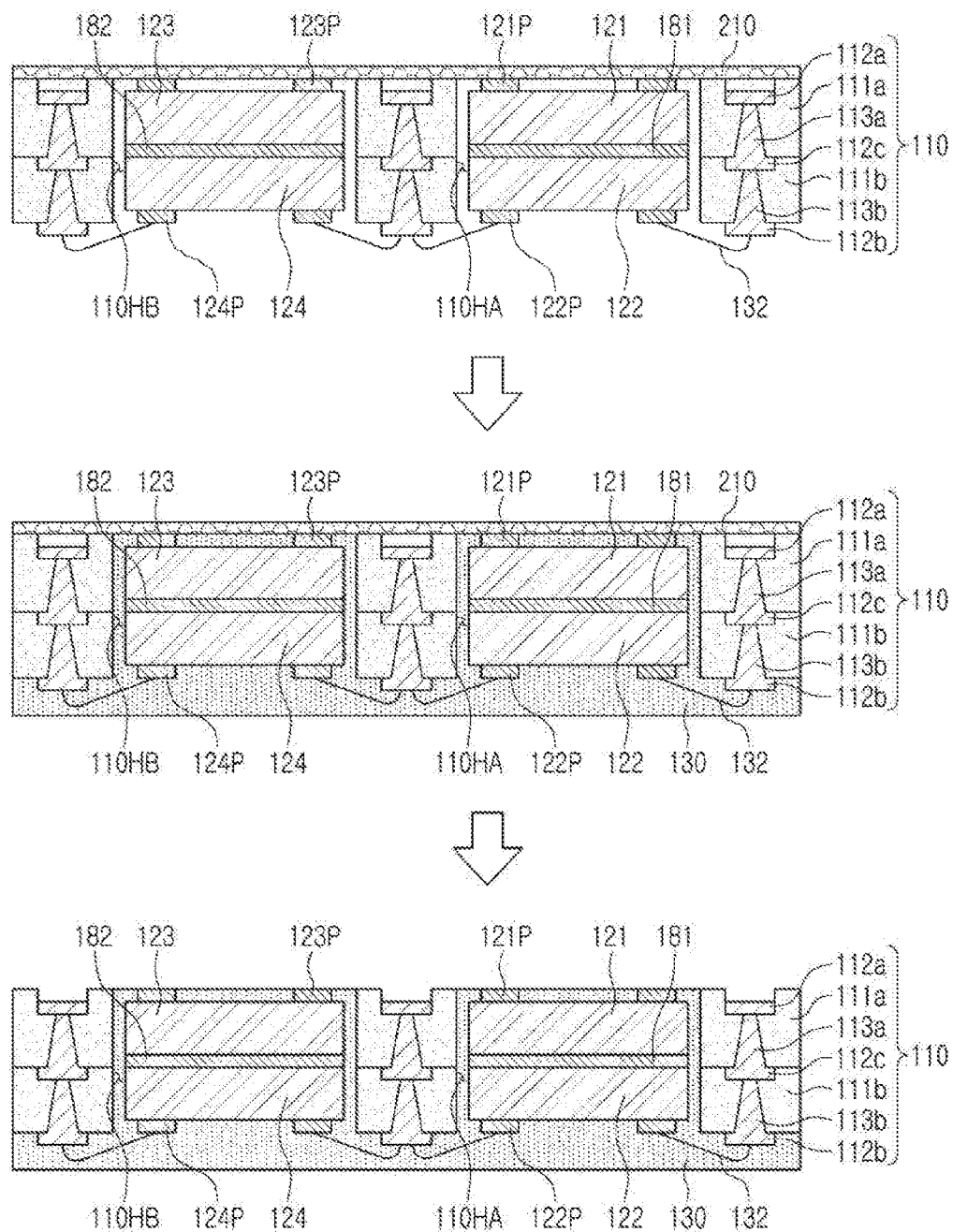
Figure 11C:
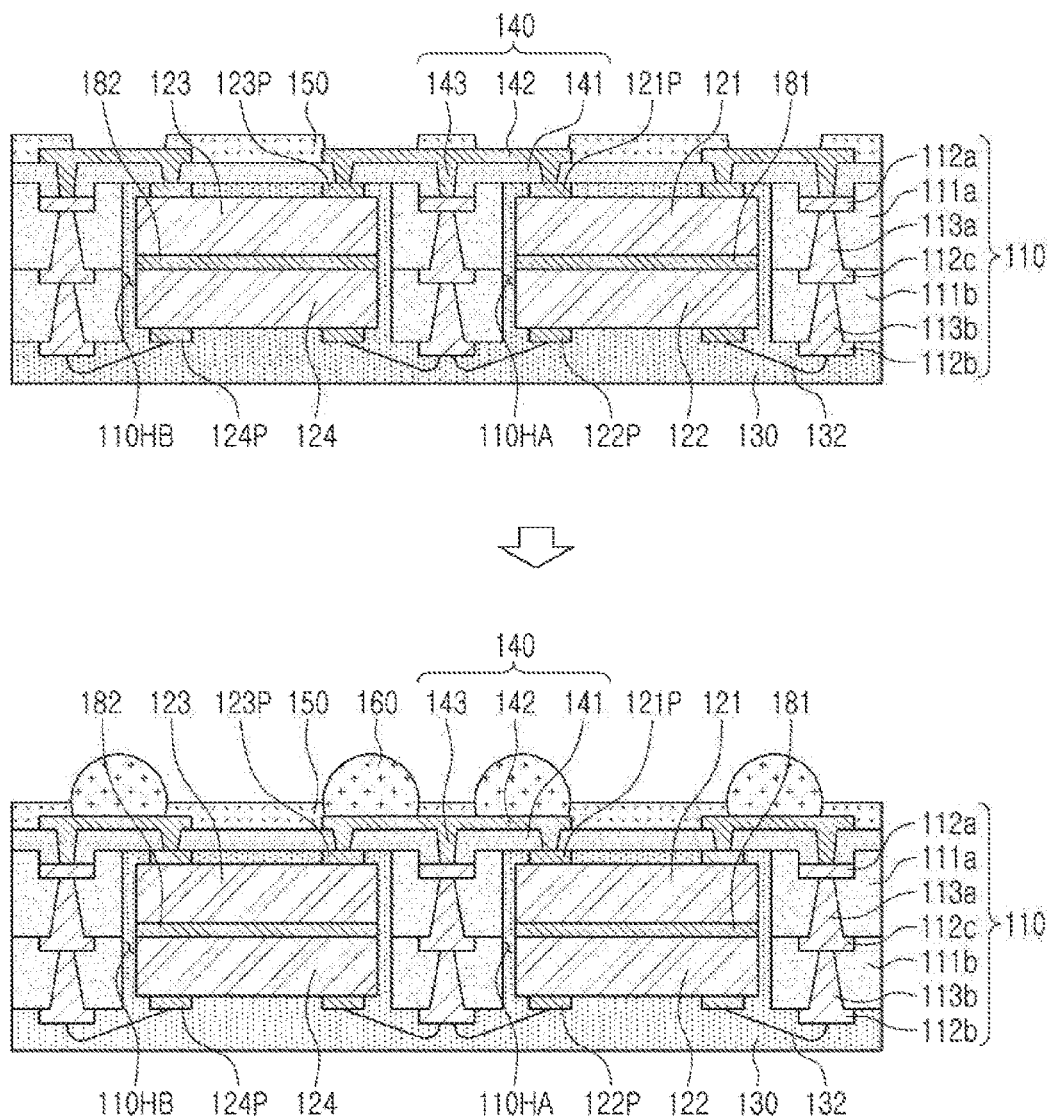

FIGS. 11A through 11C are schematic views illustrating processes of manufacturing the fan-out semiconductor package of FIG. 9.

Referring to FIG. 11A, the core member 110 may be first prepared. The core member 110 may be prepared by forming the first wiring layer 112a on a carrier substrate having a metal layer formed on one surface, by a plating process, forming the first insulating layer 111a covering the first wiring layer 112a by a lamination method or an applying method, forming via holes in the first insulating layer 111a by a laser drill, or the like, forming the first vias 113a and the third wiring layer 112c in the via holes and on the first insulating layer 111a, respectively, by a plating process, forming the second insulating layer 111b covering the third wiring layer 112c by a lamination method or an applying method, forming via holes in the second insulating layer 111b by a laser drill, or the like, forming the second vias 113b and the second wiring layer 112b in the via holes and on the second insulating layer 111b, respectively, by a plating process, forming the first and second through-holes 110HA and 110HB by a laser drill, or the like, separating the carrier substrate, and removing the remaining metal layer by etching. A series of processes may be performed using the carrier substrate having a large area. Therefore, a plurality of core members 110 may be prepared in a form in which they are connected to each other. Meanwhile, a portion of the first wiring layer 112a may be removed in an etching process, such that one surface of the first insulating layer 111a and one surface of the first wiring layer 112a may have a step therebetween. Then, any known adhesive film 210 may be attached to one surface of the first insulating layer 111a in which the first wiring layer 112a is embedded. Then, the first and second semiconductor chips 121 and 122 and the third and fourth semiconductor chips 123 and 124 having a stacked form may be disposed, respectively, in the first and second through-holes 110HA and 110HB on the adhesive film 210.

Then, referring to FIG. 11B, the second wiring layer 112b may be connected to the second connection pads 122P and the fourth connection pads 124P using the conductive wires 132. Each of the conductive wires 132 may have any known bonding wire form such as a metal wire, or the like. Then, the encapsulant 130 encapsulating at least portions of the core member 110 and the first and second semiconductor chips 121 and 122 and the third and fourth semiconductor chips 123 and 124 having the stacked form may be formed by a lamination method or an applying method. Then, the adhesive film 210 may be removed.

Then, referring to FIG. 11C, the insulating layer 141 may be formed by laminating or applying a PID, or the like, on or to a portion in which the adhesive film 210 is removed, via holes may be formed in the insulating layer 141 by a photolithography method, or the like, and the vias 143 and the redistribution layer 142 may be formed in the via holes or on the insulating layer 141 by a plating process. Such processes may be repeated to form additional insulating layer 141, redistribution layer 142, and vias 143, according to design particulars. Then, the passivation layer 150 having the openings exposing at least portions of the redistribution layer 142 may be formed by a lamination method or an applying method. Then, the electrical connection structures 160 may be formed, and a reflow process may be performed to form the fan-out semiconductor packages 100A according to the exemplary embodiment described in the plural. Then, when singulation is performed by a sawing process, a plurality of fan-out semiconductor packages 100A may be obtained at a time.

Figure 12:
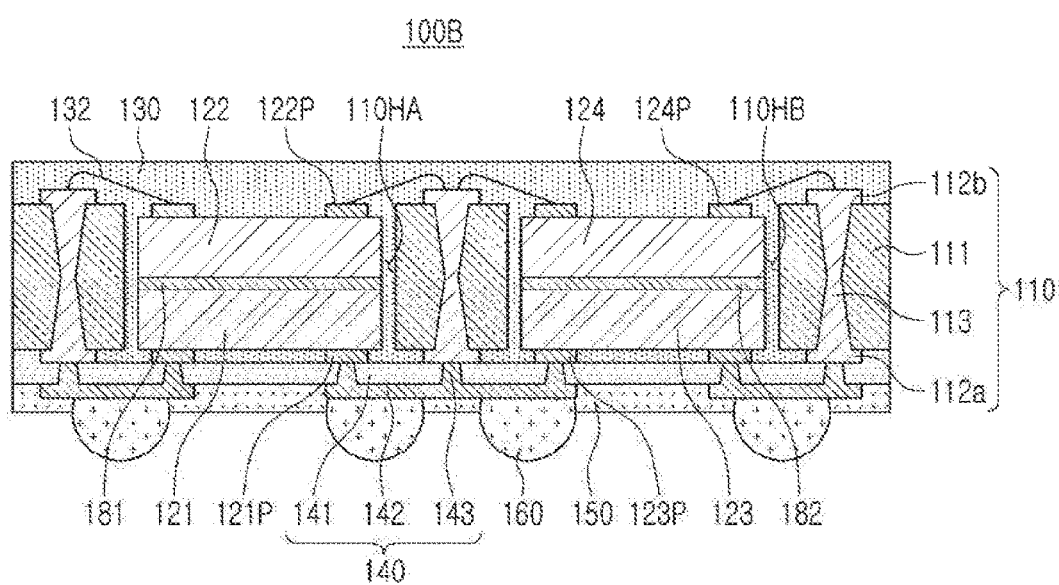
FIG. 12 is a schematic cross-sectional view illustrating another example of a fan-out semiconductor package.

FIG. 12 is a schematic cross-sectional view illustrating another example of a fan-out semiconductor package.

Referring to FIG. 12, in a fan-out semiconductor package 100B according to another exemplary embodiment in the present disclosure, a core member 110 may include an insulating layer 111, a first wiring layer 112a disposed on one surface of the insulating layer 111, a second wiring layer 112b disposed on the other surface of the insulating layer 111, and vias 113 penetrating through the insulating layer 111 and electrically connecting the first and second wiring layers 112a and 112b to each other. A thickness of each of the wiring layers 112a and 112b may be greater than that of a redistribution layer 142. Each of the vias 113 may be a through-via rather than a blind via, and may have a hourglass shape or a cylindrical shape. That is, a form of the core member 110 may be variously modified. Other contents overlap those described above, and a detailed description thereof is thus omitted.

Figure 13:
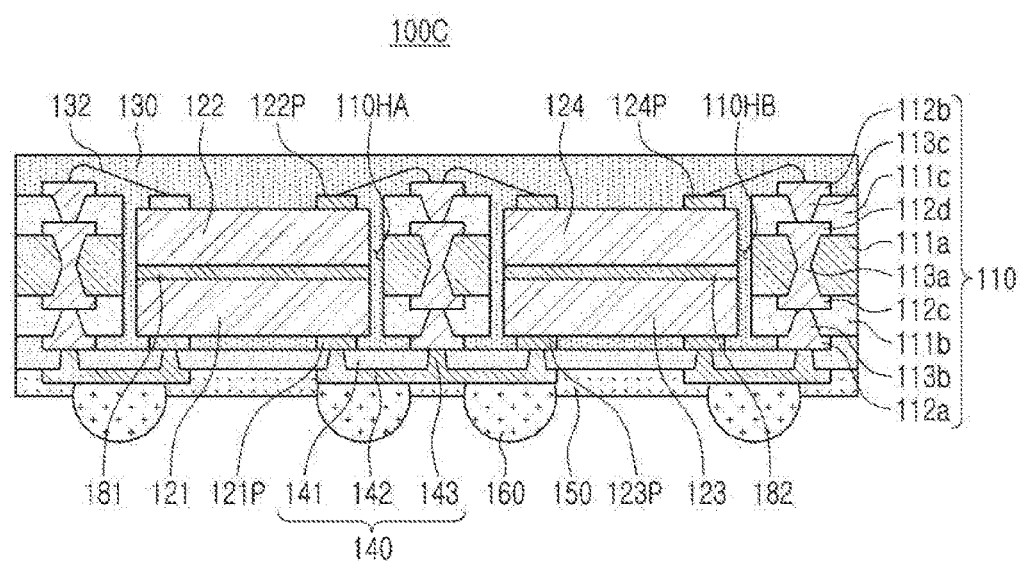
FIG. 13 is a schematic cross-sectional view illustrating another example of a fan-out semiconductor package.

FIG. 13 is a schematic cross-sectional view illustrating another example of a fan-out semiconductor package.

Referring to FIG. 13, in a fan-out semiconductor package 100C according to another exemplary embodiment in the present disclosure, a core member 110 may include a first insulating layer 111a, a third wiring layer 112c disposed on one surface of the first insulating layer 111a, a fourth wiring layer 112d disposed on the other surface of the first insulating layer 111a, a second insulating layer 111b disposed on one surface of the first insulating layer 111a and covering the third wiring layer 112c, a first wiring layer 112a disposed on the second insulating layer 111b, a third insulating layer 111c disposed on the other surface of the first insulating layer 111a and covering the fourth wiring layer 112d, and a second wiring layer 112b disposed on the third insulating layer 111c. In addition, the core member 110 may include first vias 113a penetrating through the first insulating layer 111a and electrically connecting the third and fourth wiring layers 112c and 112d to each other, second vias 113b penetrating through the second insulating layer 111b and electrically connecting the first and third wiring layers 112a and 112c to each other, and third vias 113c penetrating through the third insulating layer 111c and electrically connecting the second and fourth wiring layers 112b and 112d to each other. A thickness of each of the wiring layers 112a, 112b, 112c, and 112d may be greater than that of a redistribution layer 142. The first vias 113a may have a hourglass shape, and the second and third vias 113b and 113c may have tapered shapes of which directions are opposite to each other.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112a and 112b. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c respectively penetrating through the second insulating layer 111b and the third insulating layer 111c. Other contents overlap those described above, and a detailed description thereof is thus omitted.

Figure 14:
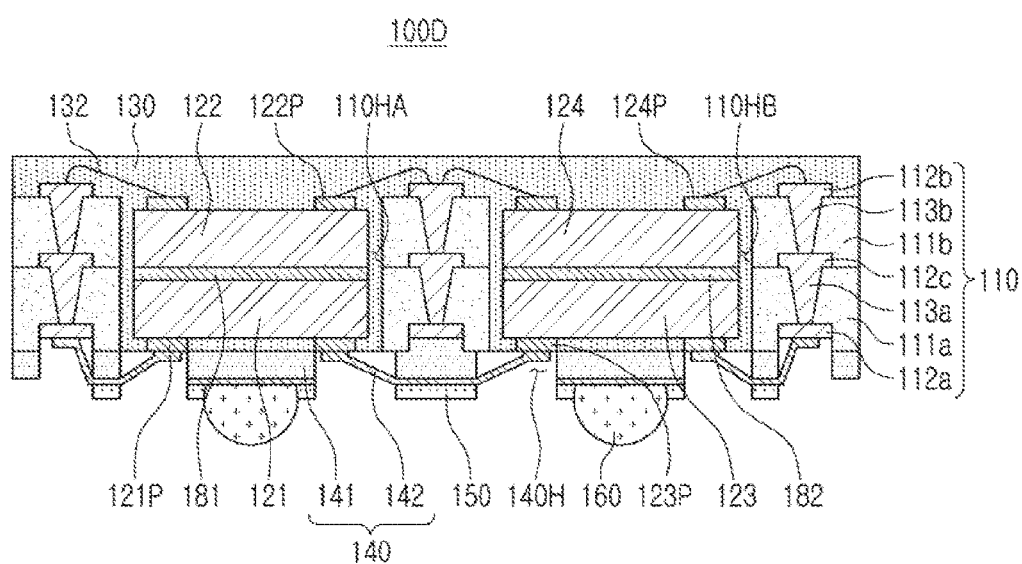
FIG. 14 is a schematic cross-sectional view illustrating another example of a fan-out semiconductor package.

FIG. 14 is a schematic cross-sectional view illustrating another example of a fan-out semiconductor package.

Figure 15:
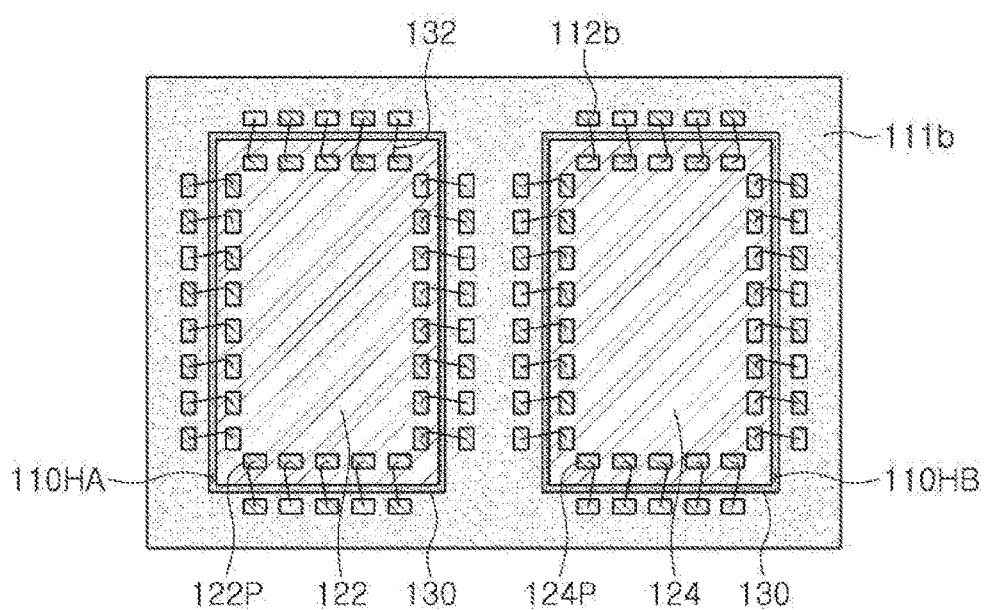
FIG. 15 is a schematic top view illustrating the fan-out semiconductor package of FIG. 14.

FIG. 15 is a schematic top view illustrating the fan-out semiconductor package of FIG. 14.

Referring to FIGS. 14 and 15, in a fan-out semiconductor package 100D according to another exemplary embodiment in the present disclosure, a connection member 140 may include an insulating layer 141 disposed on a core member 110, a first active surface, and a third active surface and having openings 140H exposing at least portions of each of a first wiring layer 112a, first connection pads 121P, and third connection pads 123P, and flexible conductors 142 disposed on the insulating layer 141, bent in the openings 140H, and electrically connecting the first wiring layer 112a to the first connection pads 121P and the third connection pads 123P. Each of the flexible conductors 142 may include a conductive material such as copper (Cu). For example, each of the flexible conductors 142 maybe a conductive tape formed of copper (Cu), but is not limited thereto. The flexible conductors 142 may be in directly contact with the first wiring layer 112a, the first connection pads 121P, and the third connection pads 123P. Meanwhile, the flexible conductors 142 may be externally exposed through other openings formed in a passivation layer 150, if necessary.

Also in a case of using a tape automated bonding type connection member 140 as in the fan-out semiconductor package 100D according to another exemplary embodiment, as described above in the fan-out semiconductor package 100A according to the exemplary embodiment, first and second semiconductor chips 121 and 122 and third and fourth semiconductor chips 123 and 124 stacked, respectively, at upper and lower portions may be disposed in a SBS form. Therefore, unlike the MDSP, the fan-out semiconductor package 100D may be thinned, and electrical connection paths between the first and second semiconductor chips 121 and 122 and the third and fourth semiconductor chips 123 and 124 may be significantly decreased. In addition, the stacked chips are not disposed to be vertically misaligned with each other, but may be disposed in the same direction unlike the MDSP, such that the fan-out semiconductor package 100D may ultimately be miniaturized. In addition, the fan-out semiconductor package 100D may have a structure in which an electrical path is provided at one side of the fan-out semiconductor package 100D through conductive wires 132, the conductive wires 132 are encapsulated with an encapsulant 130, and an electrical path is formed at the other side of the fan-out semiconductor package 100D through the flexible conductors 142 of the connection member 140 using flat one surface of the encapsulant 130 as a support member. Therefore, a degree of freedom in a design may be high, and a separate backside redistribution layer (B-RDL) process, or the like, is not required, and a process may thus be simplified. Other contents overlap those described above, and a detailed description thereof is thus omitted.

Figure 16A:
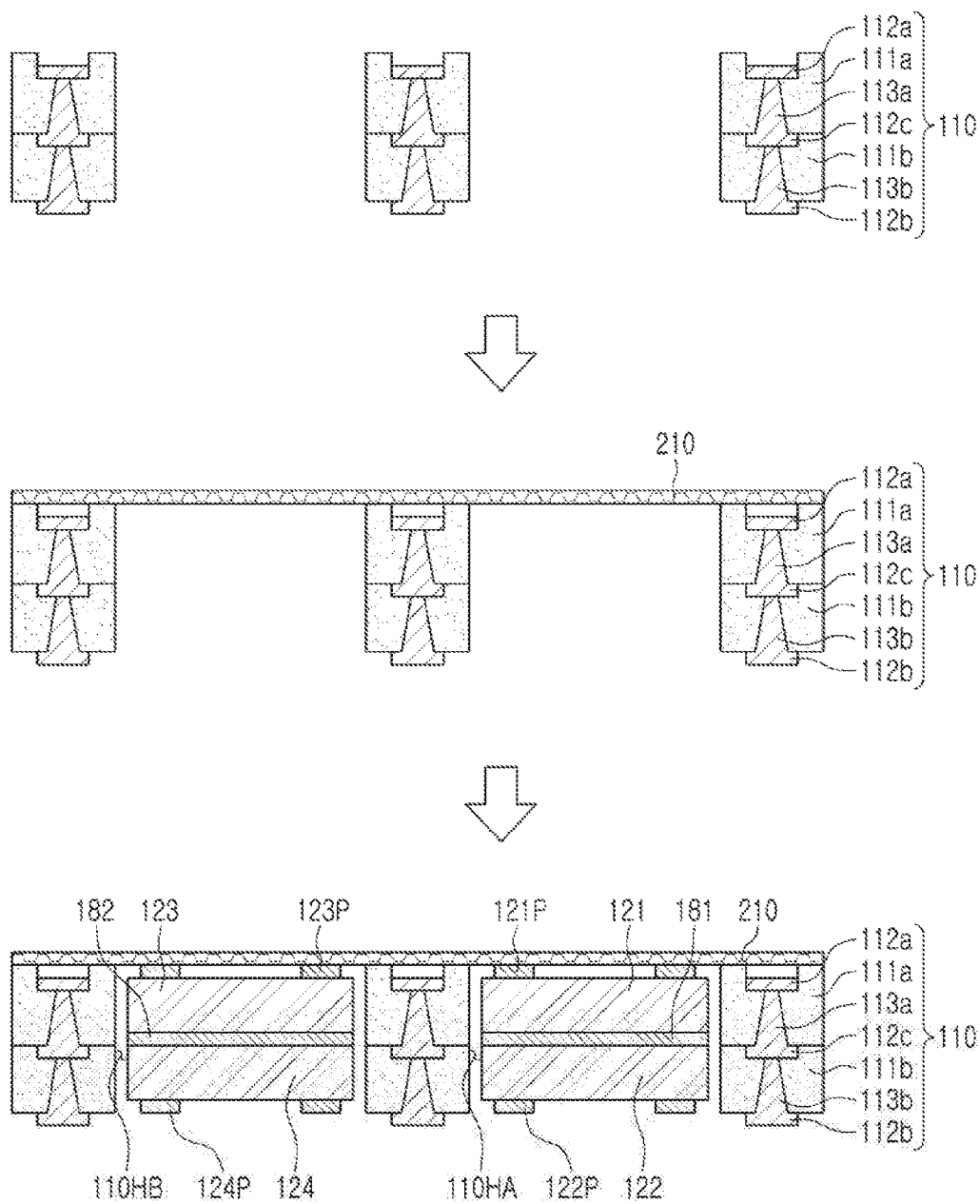
FIGS. 16A through 16C are schematic views illustrating processes of manufacturing the fan-out semiconductor package of FIG. 14.
Figure 16B:
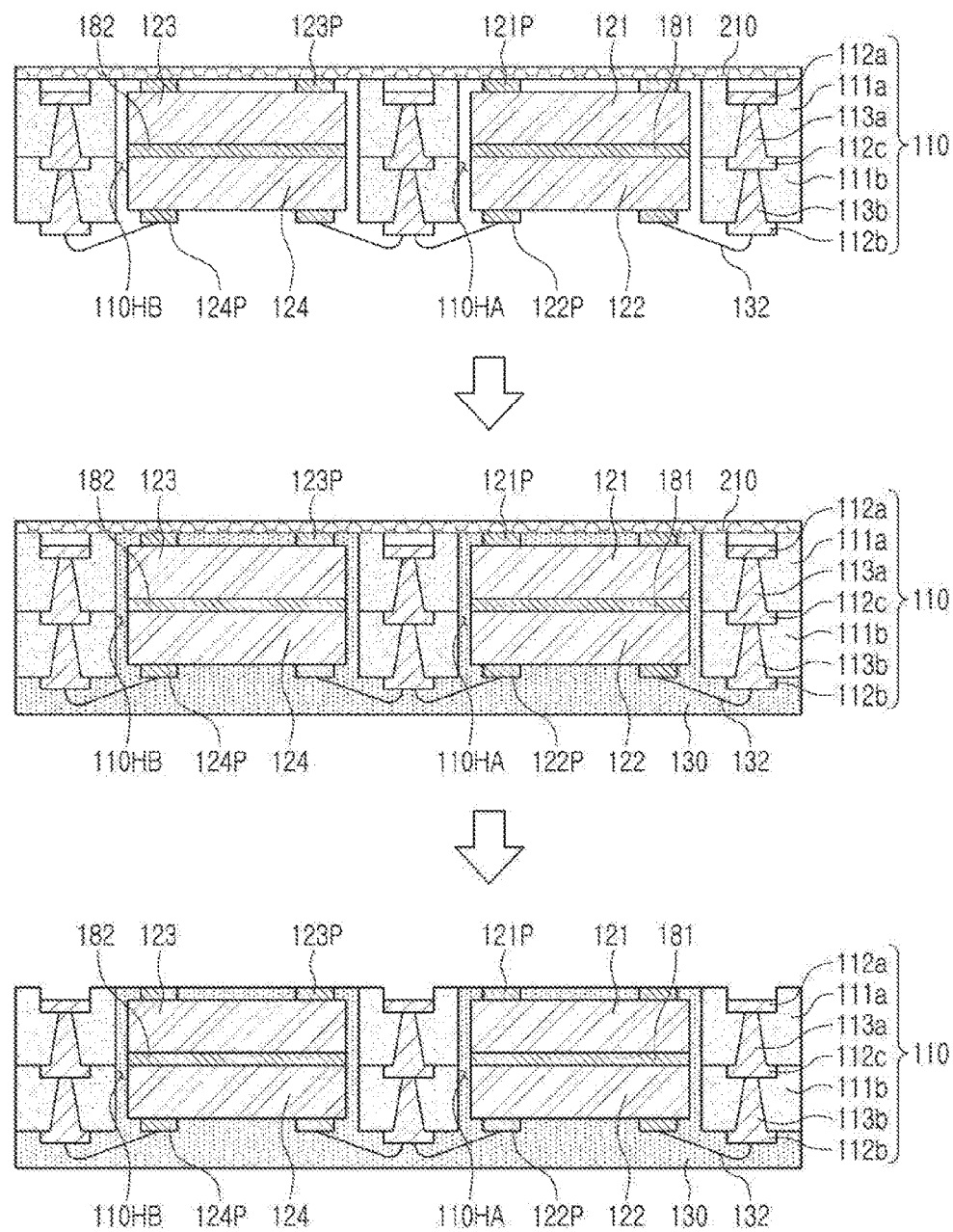
Figure 16C:
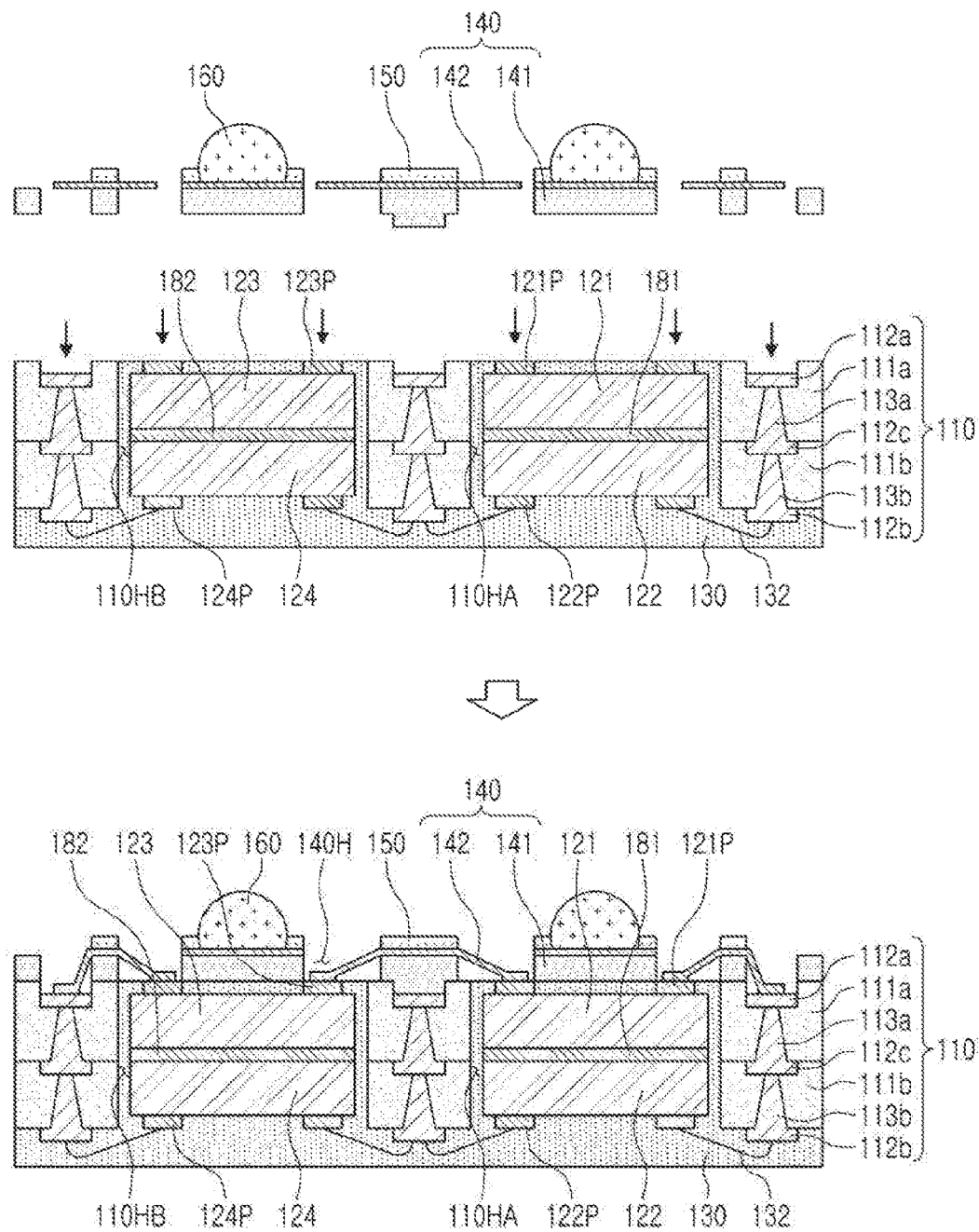

FIGS. 16A through 16C are schematic views illustrating processes of manufacturing the fan-out semiconductor package of FIG. 14.

Referring to FIG. 16A, the core member 110 may be first prepared. Then, any known adhesive film 210 may be attached to one surface of the first insulating layer 111a in which the first wiring layer 112a is embedded. Then, the first and second semiconductor chips 121 and 122 and the third and fourth semiconductor chips 123 and 124 having a stacked form may be disposed, respectively, in the first and second through-holes 110HA and 110HB on the adhesive film 210.

Then, referring to FIG. 16B, the second wiring layer 112b may be connected to the second connection pads 122P and the fourth connection pads 124P using the conductive wires 132. Then, the encapsulant 130 encapsulating at least portions of the core member 110 and the first and second semiconductor chips 121 and 122 and the third and fourth semiconductor chips 123 and 124 having the stacked form may be formed. Then, the adhesive film 210 may be removed.

Then, referring to FIG. 16C, the tape automated bonding type connection member 140 may be prepared, and be attached to a portion in which the adhesive film 210 is removed. A passivation layer 150 and electrical connection structures 160 may be in a state in which they are formed in advance in the connection member 140 or maybe formed in a subsequence process after the connection member 140 is formed. Other contents overlap those described above, and a detailed description thereof is thus omitted.

Figure 17:
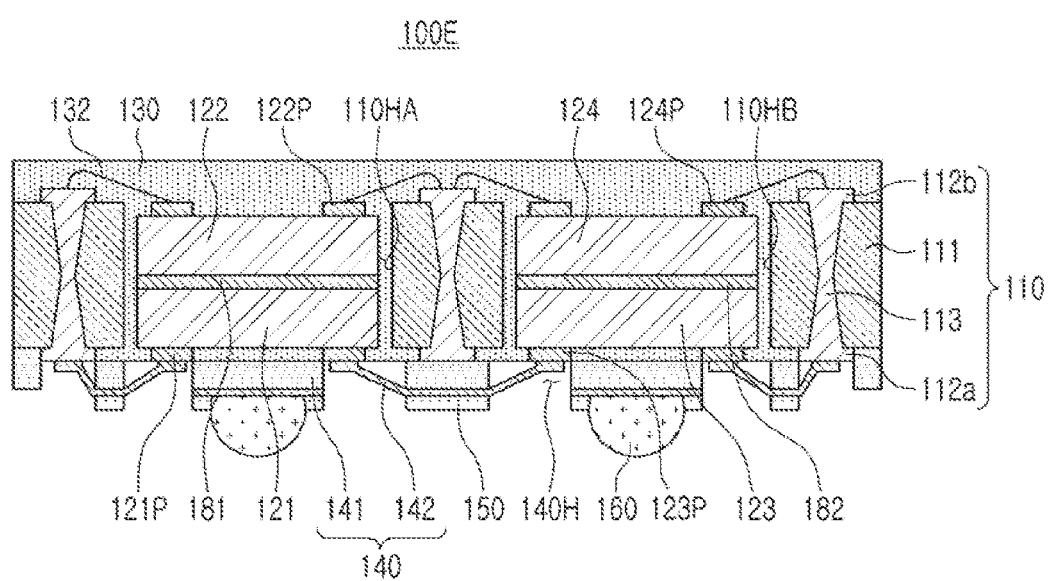
FIG. 17 is a schematic cross-sectional view illustrating another example of a fan-out semiconductor package.

FIG. 17 is a schematic cross-sectional view illustrating another example of a fan-out semiconductor package.

Referring to FIG. 17, a fan-out semiconductor package 100E according to another exemplary embodiment in the present disclosure may be the same as the fan-out semiconductor package 100D according to another exemplary embodiment except that a core member 110 may include an insulating layer 111, a first wiring layer 112a disposed on one surface of the insulating layer 111, a second wiring layer 112b disposed on the other surface of the insulating layer 111, and vias 113 penetrating through the insulating layer 111 and electrically connecting the first and second wiring layers 112a and 112b to each other. Other contents overlap those described above, and a detailed description thereof is thus omitted.

Figure 18:
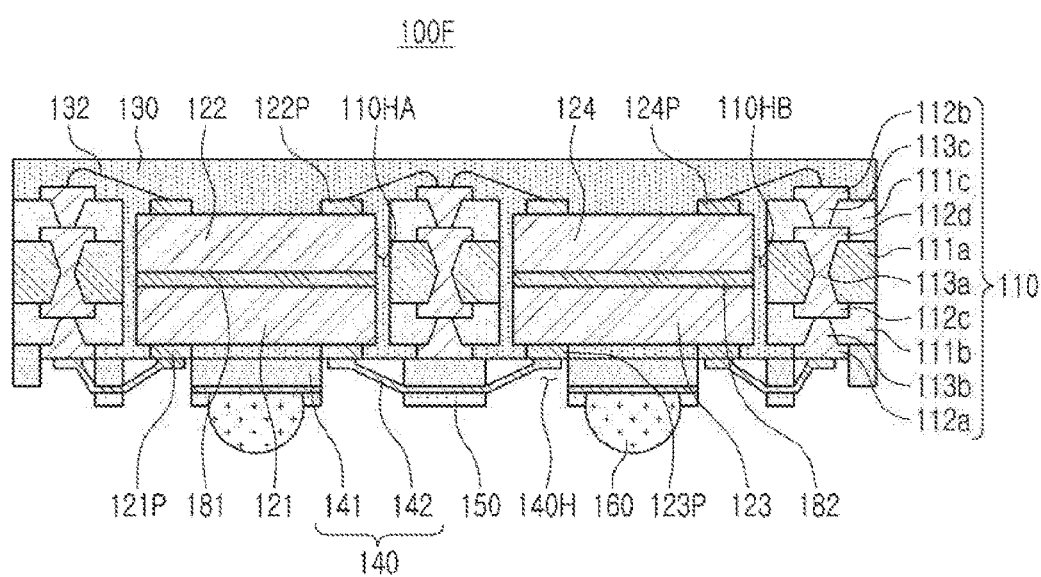
FIG. 18 is a schematic cross-sectional view illustrating another example of a fan-out semiconductor package.

FIG. 18 is a schematic cross-sectional view illustrating another example of a fan-out semiconductor package.

Referring to FIG. 18, a fan-out semiconductor package 100F according to another exemplary embodiment in the present disclosure may be the same as the fan-out semiconductor package 100D according to another exemplary embodiment except that a core member 110 may include a first insulating layer 111a, a third wiring layer 112c disposed on one surface of the first insulating layer 111a, a fourth wiring layer 112d disposed on the other surface of the first insulating layer 111a, a second insulating layer 111b disposed on one surface of the first insulating layer 111a and covering the third wiring layer 112c, a first wiring layer 112a disposed on the second insulating layer 111b, a third insulating layer 111c disposed on the other surface of the first insulating layer 111a and covering the fourth wiring layer 112d, and a second wiring layer 112b disposed on the third insulating layer 111c. In addition, the core member 110 may include first vias 113a penetrating through the first insulating layer 111a and electrically connecting the third and fourth wiring layers 112c and 112d to each other, second vias 113b penetrating through the second insulating layer 111b and electrically connecting the first and third wiring layers 112a and 112c to each other, and third vias 113c penetrating through the third insulating layer 111c and electrically connecting the second and fourth wiring layers 112b and 112d to each other. Other contents overlap those described above, and a detailed description thereof is thus omitted.

As set forth above, according to the exemplary embodiments in the present disclosure, a fan-out semiconductor package capable of having improved performance and being miniaturized and thinned by stacking a plurality of semiconductor chips in a multi-chip form, and having a high degree of freedom in a design may be provided.

While exemplary embodiments have been shown and described above, it will be apparent to those skilled in the art that modifications and variations could be made without departing from the scope of the present invention as defined by the appended claims.

What is claimed is:
1. A fan-out semiconductor package comprising:
   a core member having a first through-hole and including first and second wiring layers disposed on different levels;
   a first semiconductor chip having a first active surface having first connection pads disposed thereon and a first inactive surface opposing the first active surface and disposed in the first through-hole;

a second semiconductor chip having a second active surface having second connection pads disposed thereon and a second inactive surface opposing the second active surface and disposed on the first semiconductor chip in the first through-hole so that the second inactive surface faces the first inactive surface;

conductive wires disposed on the core member and the second active surface and electrically connecting the second connection pads and the second wiring layer to each other;

an encapsulant covering at least portions of the core member, the first semiconductor chip, and the second semiconductor chip, the encapsulant filling at least portions of the first through-hole and embedding the conductive wires;

a connection member disposed on the core member and the first active surface and electrically connecting the first connection pads and the first wiring layer to each other;

a passivation layer disposed on a surface of the connection member opposing another surface of the connection member on which the core member is disposed and having openings exposing at least portions of the connection member; and electrical connection structures disposed in the openings of the passivation layer and electrically connected to the exposed portions of the connection member, wherein the first and second semiconductor chips are spaced apart from the core member by the encapsulant.

2. The fan-out semiconductor package of claim 1, wherein the connection member includes an insulating layer disposed on the core member and the first active surface and covering at least portions of the first wiring layer and the first connection pads, a redistribution layer disposed on the insulating layer, and vias penetrating through the insulating layer and electrically connecting the redistribution layer to the first wiring layer and the first connection pads.

3. The fan-out semiconductor package of claim 2, wherein the insulating layer includes a photoimagable dielectric (PID) resin.

4. The fan-out semiconductor package of claim 1, wherein the connection member includes an insulating layer disposed on the core member and the first active surface and having openings exposing at least portions of each of the first wiring layer and the first connection pads and flexible conductors disposed on the insulating layer, bent in the openings of the insulating layer, and electrically connecting the first wiring layer and the first connection pads to each other.

5. The fan-out semiconductor package of claim 4, wherein the flexible conductor is in direct contact with the first wiring layer and the first connection pad.

6. The fan-out semiconductor package of claim 1, wherein edges of the first and second semiconductor chips are aligned with each other in a stacking direction of the first and second semiconductor chips.

7. The fan-out semiconductor package of claim 1, wherein the number of first connection pads is greater than that of second connection pads.

8. The fan-out semiconductor package of claim 1, wherein the core member includes a first insulating layer, the first wiring layer embedded in the first insulating layer so that one surface thereof is exposed, a third wiring layer disposed on the other surface of the first insulating layer opposing the one surface of the first insulating layer in which the first wiring layer is embedded, a second insulating layer disposed on the first insulating layer and covering the third wiring layer, and the second wiring layer disposed on the second insulating layer, and the first to third wiring layers are electrically connected to each other.

9. The fan-out semiconductor package of claim 8, wherein the one surface of the first insulating layer and one surface of the first wiring layer have a step therebetween.

10. The fan-out semiconductor package of claim 1, wherein the core member includes a first insulating layer, the first wiring layer disposed on one surface of the first insulating layer, and the second wiring layer disposed on the other surface of the first insulating layer, and the first and second wiring layers are electrically connected to each other.

11. The fan-out semiconductor package of claim 1, wherein the core member includes a first insulating layer, a third wiring layer disposed on one surface of the first insulating layer, a fourth wiring layer disposed on the other surface of the first insulating layer, a second insulating layer disposed on the one surface of the first insulating layer and covering the third wiring layer, the first wiring layer disposed on the second insulating layer, a third insulating layer disposed on the other surface of the first insulating layer and covering the fourth wiring layer, and the second wiring layer disposed on the third insulating layer, and the first to fourth wiring layers are electrically connected to each other.

12. The fan-out semiconductor package of claim 11, wherein the first insulating layer has a thickness greater than that of each of the second and third insulating layers.

13. The fan-out semiconductor package of claim 1, wherein the core member further has a second through-hole spaced apart from the first through-hole, the fan-out semiconductor package further comprises: a third semiconductor chip having a third active surface having third connection pads disposed thereon and a third inactive surface opposing the third active surface is disposed in the second through-hole, and a fourth semiconductor chip having a fourth active surface having fourth connection pads disposed thereon and a fourth inactive surface opposing the fourth active surface is disposed on the third semiconductor chip in the second through-hole so that the fourth inactive surface faces the third inactive surface, the conductive wires electrically connect the fourth connection pads and the second wiring layer to each other, and the connection member electrically connects the third connection pads and the first wiring layer to each other.

14. The fan-out semiconductor package of claim 13, wherein the first and second semiconductor chips stacked in the first through-hole and the third and fourth semiconductor chips stacked in the second through-hole are disposed side-by-side, and are electrically connected to each other through the connection member.

15. A fan-out semiconductor package comprising:

a core member having a first through-hole and including first and second wiring layers disposed on different levels;

a first semiconductor chip having a first active surface having first connection pads disposed thereon and a first inactive surface opposing the first active surface and disposed in the first through-hole;

a second semiconductor chip having a second active surface having second connection pads disposed thereon and a second inactive surface opposing the second active surface and disposed on the first semiconductor chip in the first through-hole so that the second inactive surface faces the first inactive surface;

conductive wires disposed on the core member and the second active surface and electrically connecting the second connection pads and the second wiring layer to each other;

an encapsulant covering at least portions of the core member, the first semiconductor chip, and the second semiconductor chip, the encapsulant filling at least portions of the first through-hole and embedding the conductive wires;

an insulating layer and a passivation layer disposed on the core member and the first active surface and having first openings exposing at least portions of each of the first wiring layer and the first connection pads; and flexible conductors each including a first portion embedded between the insulating layer and the passivation layer, and second and third portions respectively bent from opposite sides of the first portion, exposed from the insulating layer and the passivation layer, and respectively connected to one of the first connection pads and one of the exposed portions of the first wiring layer.

16. The fan-out semiconductor package of claim 15, wherein the core member includes a first insulating layer, the first wiring layer embedded in the first insulating layer so that one surface thereof is exposed, a third wiring layer disposed on the other surface of the first insulating layer opposing the one surface of the first insulating layer in which the first wiring layer is embedded, a second insulating layer disposed on the first insulating layer and covering the third wiring layer, and the second wiring layer disposed on the second insulating layer, and the first to third wiring layers are electrically connected to each other.

17. The fan-out semiconductor package of claim 16, wherein the one surface of the first insulating layer and one surface of the first wiring layer have a step therebetween.

18. The fan-out semiconductor package of claim 15, wherein the core member includes a first insulating layer, a third wiring layer disposed on one surface of the first insulating layer, a fourth wiring layer disposed on the other surface of the first insulating layer, a second insulating layer disposed on the one surface of the first insulating layer and covering the third wiring layer, the first wiring layer disposed on the second insulating layer, a third insulating layer disposed on the other surface of the first insulating layer and covering the fourth wiring layer, and the second wiring layer disposed on the third insulating layer, and the first to fourth wiring layers are electrically connected to each other.

19. The fan-out semiconductor package of claim 18, wherein the first insulating layer has a thickness greater than that of each of the second and third insulating layers.

20. The fan-out semiconductor package of claim 15, further comprising electrical connection structures disposed in second openings of the passivation layer and electrically connected to portions of the flexible conductors exposed by the second openings.

* * * * *